US007385396B2

(12) United States Patent
Zhu

(10) Patent No.: US 7,385,396 B2
(45) Date of Patent: Jun. 10, 2008

(54) SAR REDUCTION IN MR IMAGING WITH PARALLEL RF TRANSMISSION

(75) Inventor: Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 74 days.

(21) Appl. No.: 11/379,403

(22) Filed: Apr. 20, 2006

(65) Prior Publication Data
US 2007/0247155 A1    Oct. 25, 2007

(51) Int. Cl.
*G01V 3/00*    (2006.01)

(52) U.S. Cl. .................................... 324/309; 324/307

(58) Field of Classification Search ................ 324/309, 324/307, 318
See application file for complete search history.

(56) References Cited

U.S. PATENT DOCUMENTS

| | | | |
|---|---|---|---|
| 6,759,847 B2 * | 7/2004 | Brinker et al. ............... | 324/309 |
| 6,879,158 B2 | 4/2005 | Zhu | |
| 6,989,673 B2 | 1/2006 | Zhu | |
| 7,053,618 B2 | 5/2006 | Zhu | |
| 7,075,301 B2 * | 7/2006 | Zhu ............................ | 324/318 |
| 7,075,302 B2 * | 7/2006 | Zhu ............................ | 324/318 |
| 2005/0134267 A1 | 6/2005 | Zhu | |
| 2006/0132132 A1 | 6/2006 | Zhu et al. | |
| 2006/0132133 A1 | 6/2006 | Zhu et al. | |

OTHER PUBLICATIONS

IEC 60601-2-33, Second Edition May 2002, Medical Electrical Equipment, Part 2-33: Particular requirements for the safety of magnetic resonance equipment for medical diagnosis, pp. 1, 28 and 29.
Y. Zhu et al., "Parallel Excitation With an Array of Transmit Coils," Magnetic Resonance in Medicine vol. 51, pp. 775-784, 2004.
Y. Zhu et al., "Parallel Excitation on an Eight Transmit-Channel MRI System," Proc. Intl. Soc. Mag. Res. Med., vol. 13, 2005.
Y. Zhu, "RF Power Reduction with Parallel Excitation," Proc. Intl. Soc. Mag. Res. Med., vol. 11, 2004.
K. P. Pruessmann et al., "SENSE: Sensitivity encoding for Fast MRI," Magnetic Resonance in Medicine, vol. 42, pp. 952-962, 1999.

* cited by examiner

*Primary Examiner*—Louis M Arana
(74) *Attorney, Agent, or Firm*—Scott J. Asmus; Patrick K. Patnode

(57) ABSTRACT

A computer readable storage medium in an example has a computer program stored thereon and represents a set of instructions that when executed by a computer during MR imaging causes the computer to: acquire a B1 field map for each transmit coil of a parallel RF transmit coil array; determine with a computational algorithm an excitation pulse scheme for a target excitation profile based on at least one effective B1 field map for a plurality of transmit coils of the parallel RF transmit coil array; and generate at least one SAR-reduced RF pulsing sequence for a respective transmit coil of the plurality of transmit coils of the parallel RF transmit coil array. The parallel RF transmit coil array is capable of having any parallel RF transmit coil array geometry. Each effective B1 field map reflects inductive coupling effects present between a transmit coil and at least another transmit coil.

20 Claims, 4 Drawing Sheets

SAR REDUCTION IN MR IMAGING WITH PARALLEL RF TRANSMISSION

BACKGROUND OF THE INVENTION

The present invention relates generally to MR imaging and, more particularly, to parallel excitation by a transmit coil array to realize a desired excitation profile. The present invention further relates to a parallel excitation pulse design that reduces RF power deposition on a subject.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

Spatially selective excitation is widely used in MR imaging to induce transverse magnetization while limiting the size of the signal-contributing volume. Slice-selective excitation, the most commonly used, confines the signal-contributing volume to a fixed slice and thereby simplifies spatial encoding during signal acquisition and reduces scan time. Multi-dimensional excitation that produces localization along more than one dimension has been used to further this reduction in scan time. Its applications include, for example, localized spectroscopy, reduced-FOV scan of a region of interest, imaging of a target anatomy of unique shape, and echo planar imaging (EPI) with a shortened echo train length. In addition, profile (flip, phase and frequency) control across a sizeable volume with selective excitation has been exploited to improve excitation profile fidelity in the presence of B0 inhomogeneity or gradient non-linearity, and to reduce susceptibility artifacts.

Selective excitation is commonly implemented with a single transmit coil that transmits across an entire volume and produces a relatively uniform B1 field, e.g., a birdcage coil. Highly efficient pulse algorithms have been developed for designing excitation pulses that suit such a configuration. Notwithstanding the advantages achieved by these pulse design tools, technical difficulties remain. Issues with excitation pulse duration, excitation profile accuracy, and RF power absorption (SAR: specific absorption rate; measure of the rate of absorption of RF energy in the body) represent some of the outstanding challenges in a variety of applications. Compared to 1D excitation, flexible profile control along multiple dimensions with 2D or 3D excitation entails intensified pulsing activity and often requires powerful gradients to keep pulse duration in check. This limitation hinders applications of multi-dimensional excitation on scanners with general-purpose gradients. Substantial subject-dependency of $B_1$ field, resulting from increased wave behavior and source-subject interaction at high frequencies, may also contribute to the difficulty of excitation profile control. An elevated rate of RF power deposition at high frequencies represents yet another factor that has a significant impact on the design and application of RF transmit modules and/or excitation pulses.

BRIEF DESCRIPTION OF THE INVENTION

The present invention provides independent controlling of transmit coils of a transmit coil array to conduct RF excitation in an imaging volume that overcomes the aforementioned drawbacks.

The present invention is directed to the acceleration of multi-dimensional excitation and control of SAR through the orchestrated driving of multiple transmit coils. The present invention emphasizes the coordination of multiple transmit elements to effect appropriate B1 spatiotemporal variations in a composite B1 field in order to effectively manage RF power absorption and multi-dimensional pulse length while facilitating faithful production of desired excitation profiles.

The invention in an implementation encompasses a computer readable storage medium. The computer readable storage medium in an example has a computer program stored thereon and represents a set of instructions that when executed by a computer during MR imaging causes the computer to: acquire a B1 field map for each transmit coil of a parallel RF transmit coil array; determine with a computational algorithm an excitation pulse scheme for a target excitation profile based on at least one effective B1 field map for a plurality of transmit coils of the parallel RF transmit coil array; and generate at least one SAR-reduced RF pulsing sequence for a respective transmit coil of the plurality of transmit coils of the parallel RF transmit coil array. The parallel RF transmit coil array is capable of having any parallel RF transmit coil array geometry. Each effective B1 field map reflects inductive coupling effects present between a transmit coil and at least another transmit coil.

Another implementation of the invention encompasses an MR apparatus. The MR apparatus in an example comprises an MR system and a computer. The MR system comprises a magnet to impress a polarizing magnetic field, a plurality of gradient coils positioned about a bore of the magnet to induce a magnetic field gradient, a parallel RF transmit coil array having a plurality of transmit coils, and an RF transceiver system and an RF switch to transmit RF pulses and to acquire MR images. The RF switch is controlled by a pulse module. The computer is programmed to: design an RF pulse waveform for each transmit coil of a plurality of transmit coils of the parallel RF transmit coil array such that RF pulse length is managed and possible excitation profile side lobes are reduced; and regulate SAR during MR imaging through independent control of the plurality of transmit coils of the parallel RF transmit coil array based on an RF pulsing sequence optimization algorithm.

A further implementation of the invention encompasses a method of MR imaging. A region-of-interest in and/or an excitation profile over an imaging volume is/are determined. An excitation pulse scheme for a target excitation profile is determined based on at least one effective B1 field map for a parallel RF transmit coil array. Each effective B1 field map reflects possible inductive coupling effects that exist between a transmit coil and at least another transmit coil. RF pulsing of a plurality of transmit coils of the parallel RF transmit coil array is independently controlled such that RF power deposition is reduced.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
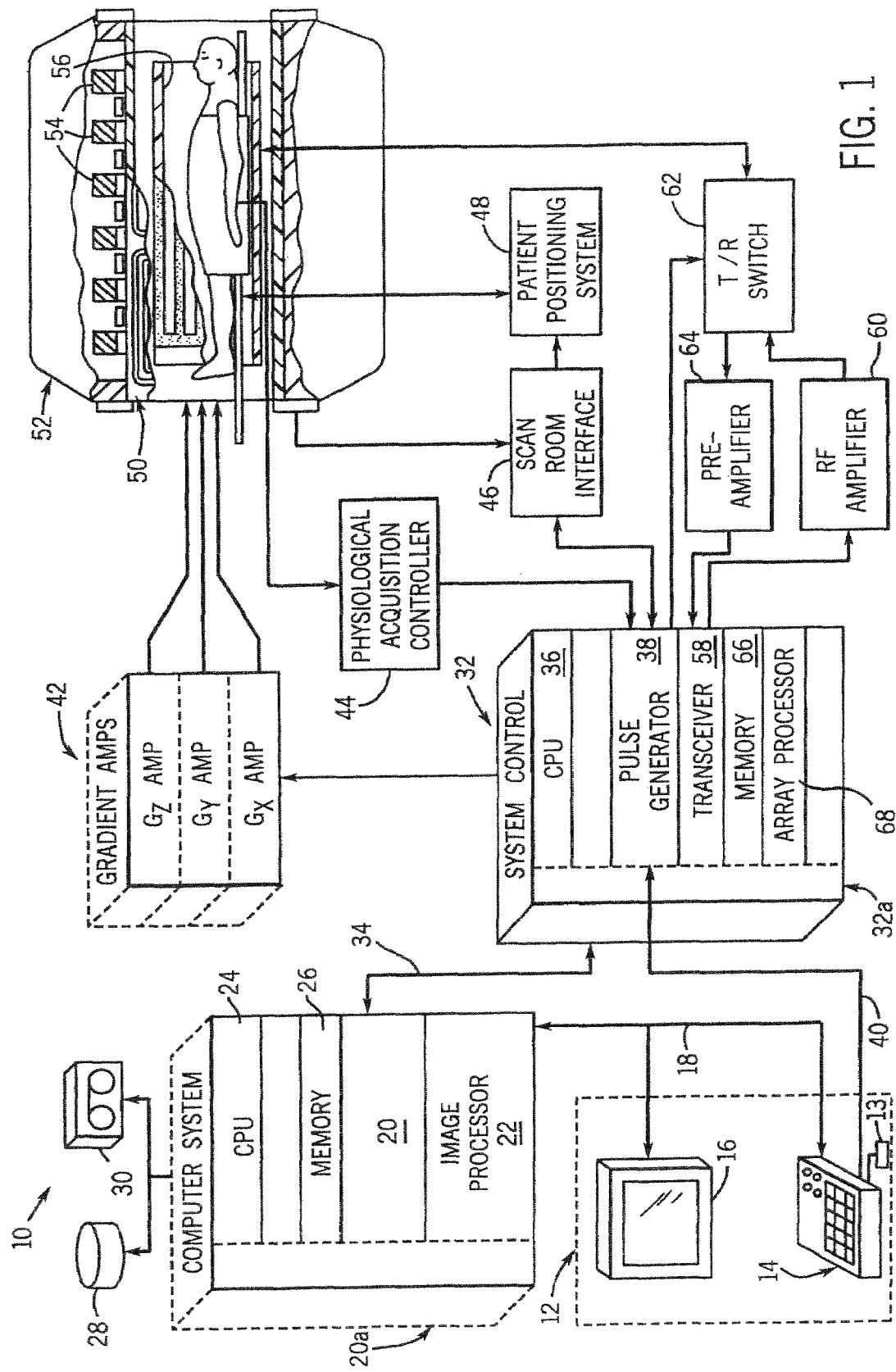
FIG. 1 is a schematic block diagram of an MR imaging system for use with the present invention.

Referring to FIG. 1, the major components of a preferred magnetic resonance (MR) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
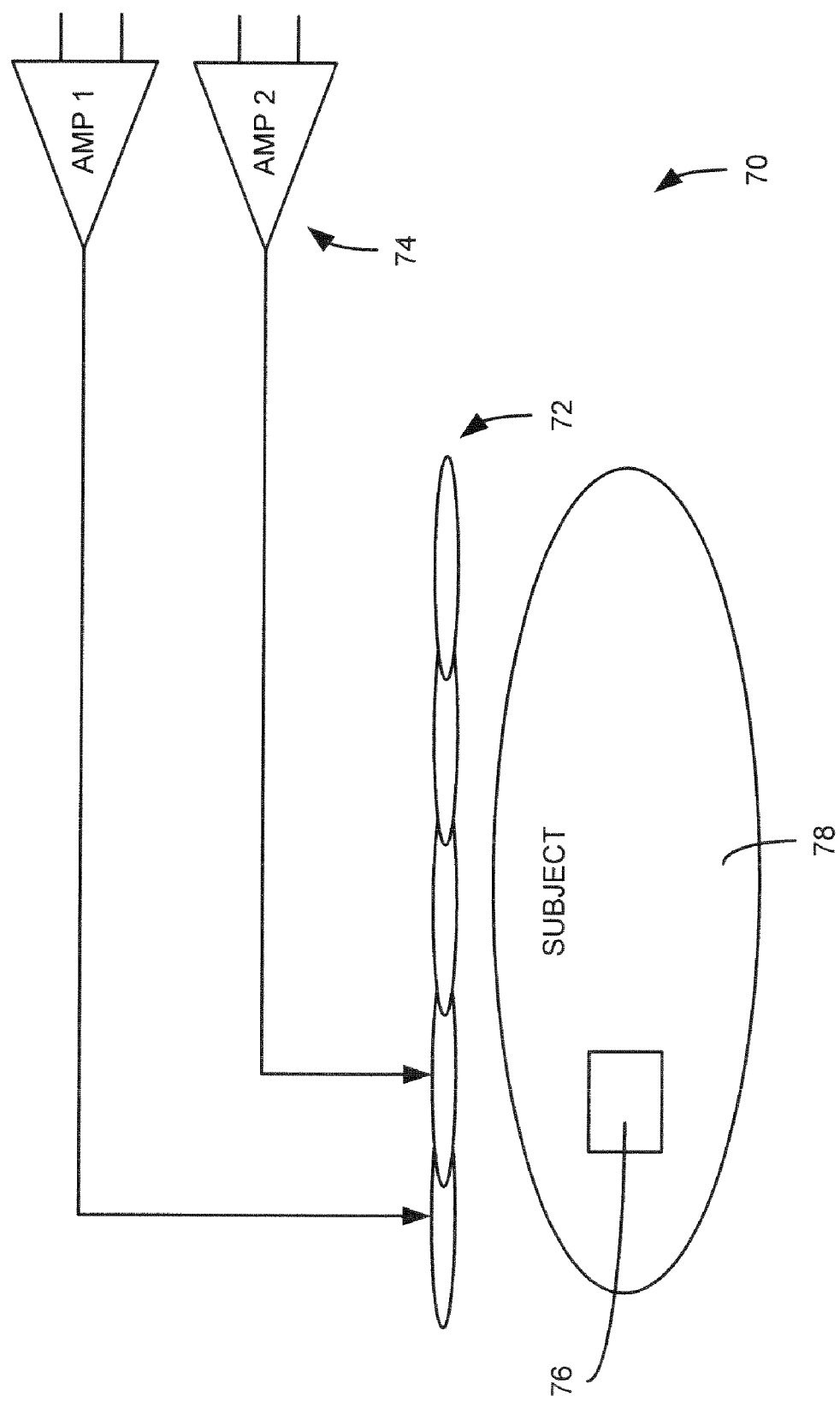
FIG. 2 is a block diagram illustrating a linear transmit coil array assembly in accordance with one aspect of the present invention.

An exemplary approach is directed to a method and system of accelerating RF pulse transmission by a plurality of transmit coils. Such a transmit coil array is illustrated in FIG. 2. Transmit coil array assembly 70 includes a plurality of RF coils or elements 72 that are designed for parallel RF transmission, and a plurality of RF amplifiers 74. In one preferred embodiment, each transmit coil 72 is driven by a dedicated RF amplifier 74. In this regard, each RF amplifier is configured to generate a controlled current in a respective RF coil for defining and/or steering an excitation volume 76 of a subject 78 within an MR system. As illustrated in FIG. 2, the transmit coils 72 are arranged in a substantially linear fashion. Additionally, as will be described in greater detail, the RF amplifiers provide controlled currents to the plurality of RF transmit coils such that RF power deposition is further reduced.

Figure 3:
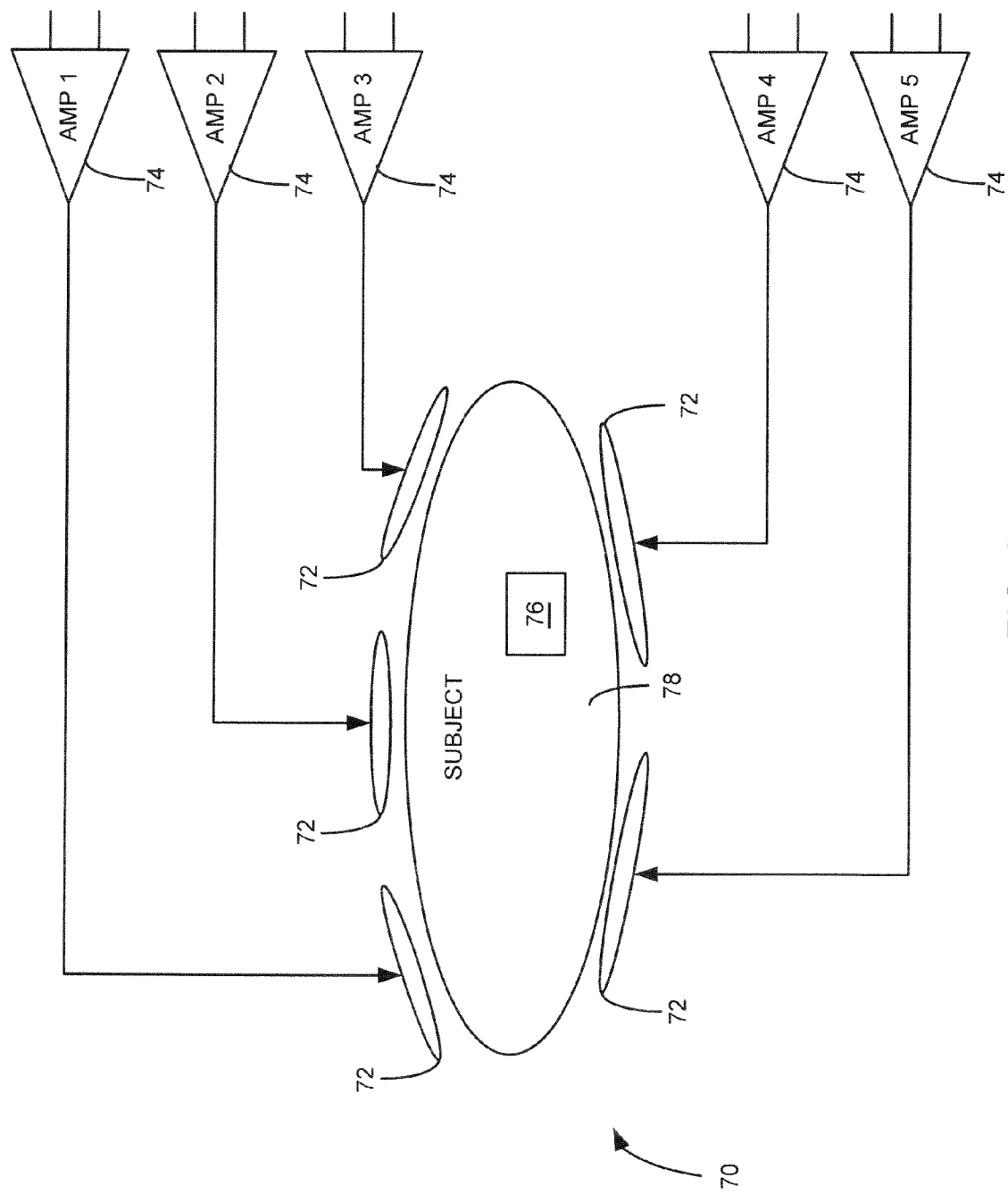
FIG. 3 is a block diagram illustrating a wrap-around transmit coil array assembly in accordance with another aspect of the present invention.

Referring now to FIG. 3, transmit coil array assembly 70 is illustrated in another embodiment. In this embodiment, the transmit coils 72 are positioned in a wrap-around manner. In this regard, the coils are arranged in a distributed manner around the subject. Similar to that shown and described with respect to FIG. 2, each RF coil 72 is connected to a dedicated RF amplifier 74. One skilled in the art will readily appreciate that FIGS. 2-3 illustrate a pair of possible arrangements of the coils of a transmit coil array and that other arrangements not specifically illustrated are possible and contemplated.

As indicated above, an exemplary approach is directed to a method and system operable with a transmit coil array such that RF excitation by the transmit coils is carried out in parallel. This parallel excitation not only supports a reduction in scan time through the acceleration of RF pulses and the localization of targeted excitation, but also supports reduction in RF power deposition on a subject.

An exemplary approach will be described with respect to a small-tip-angle excitation, but one skilled in the art will appreciate that the exemplary approach is extendable to other excitation regimes. The transverse magnetization resulting from a small-tip-angle excitation with a single transmit coil may be analyzed by the Fourier transform of the k-space trajectory traversed and weighted during the excitation:

$$M(x) = j\gamma M_0(x) b(x) \int_k W(k) S(k) e^{j2\pi k \cdot x} dk \quad \text{Exemplary equation 1,}$$

where $S(k)$ represents a spatial-frequency sampling trajectory controlled by the switching gradients, $W(k)$, a spatial-frequency weighting induced by the RF pulse driving the transmit coil, and $b(x)$, a spatial weighting induced by the coil's $B_1$ field (i.e., the radio-frequency magnetic field) pattern.

With parallel excitation, more than one set of pulse synthesizers and amplifiers in an example form parallel RF sources. In this case, a plurality of RF pulses simultaneously drives corresponding coils during excitation, inducing multiple spatial-frequency and spatial weightings that influence the creation of the transverse magnetization. Within the limits of the small-tip-angle approximation, the k-space perspective expressed by exemplary equation 1 may be extended to analyze parallel excitation based on the property of linearity:

$$M(x) = j\gamma M_0(x) \sum_{n=1}^{N} b^{(n)}(x) \int_k W^{(n)}(k) S(k) e^{j2\pi k \cdot x} dk \quad \text{Exemplary equation 2}$$

In exemplary equation 2, N denotes the total number of transmit coils, n is coil index, $W^{(n)}(k)$'s represent spatial-frequency weightings induced by the independently controlled RF pulses, and $b^{(n)}(x)$'s represent spatial weightings induced by the respective coils' effective $B_1$ field patterns. The resulting excitation profile, $\mu(x)$, is therefore $$\mu(x) = \sum_{n=1}^{N} b^{(n)}(x) \int_k W^{(n)}(k) S(k) e^{j2\pi k \cdot x} dk \quad \text{Exemplary equation 3}$$

As an example, a 2D excitation case is considered, where an echo planar $(k_x, k_y)$ traversing trajectory, with $k_x$ being the slow direction and $\Delta_{k_x}$ being the sampling period, is applied during excitation. The k-space weighting and sampling gives rise to a 2D excitation profile, which, as defined by exemplary equation 3, is a weighted superposition of N periodic functions:

$$\mu(x, y) = \sum_{n=1}^{N} b^{(n)}(x, y) \underbrace{\sum_{m=-\infty}^{+\infty} \varphi^{(n)}(x - m\Delta, y)}_{f^{(n)}(x,y)} \quad \text{Exemplary equation 4}$$

In exemplary equation 4, the notations $\varphi^{(n)}(x)$ and $\Delta$ represent, respectively, $\int W^{(n)}(k) e^{j2\pi k \cdot x} dk$ and $1/\Delta_{k_x}$. Z-dependence has been suppressed for explanatory purposes. Because of the discrete sampling along $k_x$, $f^{(n)}(x)$ is a periodic function, giving rise to main and aliasing lobes along x.

During each excitation period in an example the application of RF pulses causes RF energy dissipation in the subject. Let $\xi$ denote the total amount of subject absorbed RF energy during a complete excitation period. When quantified at a granularity matching the RF pulse sample interval, $\xi$ in an example is expressed as:

$$\xi = \sum_{p=0}^{P-1} \int \frac{1}{2} \sigma(x) |E(x, p\Delta t)|^2 \Delta t \, dv$$

where $\sigma$ denotes tissue conductivity; and p, $\Delta t$ and P represent, respectively, the sample interval index, duration (e.g., 2 µsec) and total number. Further normalizing $\xi$ with an appropriate mass measurement and a time-averaging scaling factor in an example provides, for example, head, torso, extremity or whole body average SAR (specific absorption rate; measure of the rate of absorption of RF energy in the body) as defined in FDA (Food and Drug Administration) and IEC (International Electrotechnical Commission) guidelines. SAR in an example relates to RF power deposition, RF power dissipation, and/or RF power absorption. Exemplary discussion of the IEC guidelines appears at I.60601-2-33 Medical Electrical Equipment—Part 2: Particular Requirements for the Safety of Magnetic Resonance Equipment for Medical Diagnosis. International Electrotechnical Commission, 3, rue de Varembe, P.O. Box 121, CH-1211, Geneva 20, Switzerland, 2nd Edition, 2002.

Provided that the RF field inside the subject responds linearly to the parallel RF pulses that collectively drive the field, $\xi$ in an example can be further expressed in a quadratic form in RF pulse samples:

$$\xi = \sum_{p=0}^{P-1} w_p^* \Phi w_p \quad \text{Exemplary equation 5}$$

where $\Phi$ is a positive definite matrix, and vector $w_p = [w_p^{(1)} \ldots w_p^{(N)}]$ collects all N coils' RF pulse samples for the pth interval. A quadratic-form relation and/or predetermined relation in an example serves as a basis for generation of at least one RF pulsing sequence that reduces RF power deposition across an imaging volume without causing substantial deviation of an RF excitation profile created by the transmit coil array from the target excitation profile With the exemplary analysis above on spin excitation profile and RF power absorption, the exemplary description proceeds to discuss design of parallel RF pulses that produce a desired excitation profile while ensuring low RF power absorption in the subject. The RF pulse design problem and/or optimization algorithm in an example is formulated as a constrained optimization. In an example, optimization algorithms comprise computational algorithms that determine a minimum of a function and the parameters that achieve the minimum. In another example, optimization algorithms comprise computational algorithms that determine a maximum of a function and the parameters that achieve the maximum.

Specifically, the total absorbed RF energy represented by ξ in exemplary equations 4 and 5, which tie directly to the SAR definitions by FDA and IEC, is employed as an exemplary metric to be minimized in the exemplary optimization. Given a target excitation profile, μ(x), exemplary equation 3 represents an exemplary pulse design constraint.

For illustrative purposes, one may consider the 2D example described above again. In this case, as characterized by exemplary equation 4, the parallel RF pulses induce periodic patterns that synthesize the target profile when weighted by corresponding $B_1$ profiles and superimposed. The constraint thus assumes the following form for pixel $(p_1\Delta_x, p_2\Delta_y)$:

Further results revealing reciprocity between the RF pulse and the SENSE reconstruction solutions can be derived. Exemplary discussion of SENSE reconstruction is presented in K. P. Pruessmann, M. Weiger, M. B. Scheidegger and P. Boesiger, SENSE: sensitivity encoding for fast MRI, Magn. Reson. Med., 42:952-962, 1999. In an example, analogous to SENSE SNR (signal-to-noise ratio), the impact of parallel-excitation acceleration on SAR in an example may also be examined one set of "coupled" pixels (i.e., the pixels involved in the assembly of a $C_{p_1,p_2}$ matrix) at a time and described with a ratio of the set's contribution to SAR $$\underbrace{\begin{bmatrix} b^{(1)}(p_1\Delta_x, p_2\Delta_y) & \cdots & b^{(N)}(p_1\Delta_x, p_2\Delta_y) \\ \vdots & & \vdots \\ b^{(1)}((p_1+mL)\Delta_x, p_2\Delta_y) & \cdots & b^{(N)}((p_1+mL)\Delta_x, p_2\Delta_y) \\ \vdots & & \vdots \end{bmatrix}}_{C_{p_1,p_2}} \underbrace{\begin{bmatrix} f^{(1)}(p_1\Delta_x, p_2\Delta_y) \\ \vdots \\ f^{(N)}(p_1\Delta_x, p_2\Delta_y) \end{bmatrix}}_{f_{p_1,p_2}} = \underbrace{\begin{bmatrix} \mu(p_1\Delta_x, p_2\Delta_y) \\ \vdots \\ \mu((p_1+mL)\Delta_x, p_2\Delta_y) \\ \vdots \end{bmatrix}}_{\mu_{p_1,p_2}} \quad \text{Exemplary equation 6}$$

In this 2D example, $b^{(n)}$ and μ represent, respectively, $B_1$ field distribution and the target excitation profile. $f^{(n)}$ represents the periodic pattern associated with the nth RF pulse, with the period being $L\Delta_x$ as set by the coarse $k_x$-direction sampling.

Design of SAR-reduced parallel excitation pulses in an example is directed to exemplary minimization of ξ subject to a linear constraint that is given by a collection of exemplary equation sets of the type of exemplary equation 6. With a pixel size chosen to match the spatial resolution requirement of the target profile, $f^{(n)}$ is related to the nth RF pulse's samples by Fourier transform. Using Parseval's theorem, as will be appreciated by those skilled in the art, ξ can thus be written as a quadratic form in samples of $f^{(n)}$ and the optimization algorithm can be equivalently stated as a set of independent smaller optimization algorithms, one for each pixel inside the field-of-view:

minimize $f_{p_1,p_2}*\Phi f_{p_1,p_2}$ subject to $C_{p_1,p_2}f_{p_1,p_2}=\mu_{p_1,p_2}$  Exemplary equation 7

Each of these sub-algorithms in an example is solved by:

$$f_{p_1,p_2} = \Phi^{-1}C^*_{p_1,p_2}(C_{p_1,p_2}\Phi^{-1}C^*_{p_1,p_2})^{-1}\mu_{p_1,p_2} \quad \text{Exemplary equation 8}$$

$$\xi_{min} = 1/P\sum \mu^*_{p_1,p_2}(C_{p_1,p_2}\Phi^{-1}C^*_{p_1,p_2})^{-1}\mu_{p_1,p_2}$$

In an example, exemplary equations 7 and 8 are implemented with a computational algorithm to determine an excitation pulse scheme for a target excitation profile based on at least one effective B1 field map for the transmit coils.

between an accelerated case and its unaccelerated counterpart:

$$\delta SAR^{accelerated}/\delta SAR^{unaccelerated} = g_t^2 R, \quad \text{Exemplary equation 9}$$

where $$g_t = \left[\frac{\mu^*_{p_1,p_2}(C_{p_1,p_2}\Phi^{-1}C^*_{p_1,p_2})^{-1}\mu_{p_1,p_2}/}{\mu^*_{p_1,p_2}(DIAG(C_{p_1,p_2}\Phi^{-1}C^*_{p_1,p_2}))^{-1}\mu_{p_1,p_2}}\right]^{1/2}$$

In exemplary equation 9, DIAG is an operator that sets to zeros all of a matrix's off-diagonal entries. The appearance of R, the acceleration factor, reflects the usual scaling associated with shortening transmit duration while maintaining flip angle. Factor $g_t$ captures the additional impact of acceleration. While the $g_t$-factor in an example has a dependency on the target profile, an exemplary conclusion that generally holds is that the largest eigenvalue of the inverse matrix in the nominator is always greater than or equal to that of the inverse matrix in the denominator, implying certain SAR penalty in the worst case and possible penalty in others. Exemplary equation 9 in an example serves to quantify relative reduction in the RF power deposition across an imaging volume.

Figure 4:
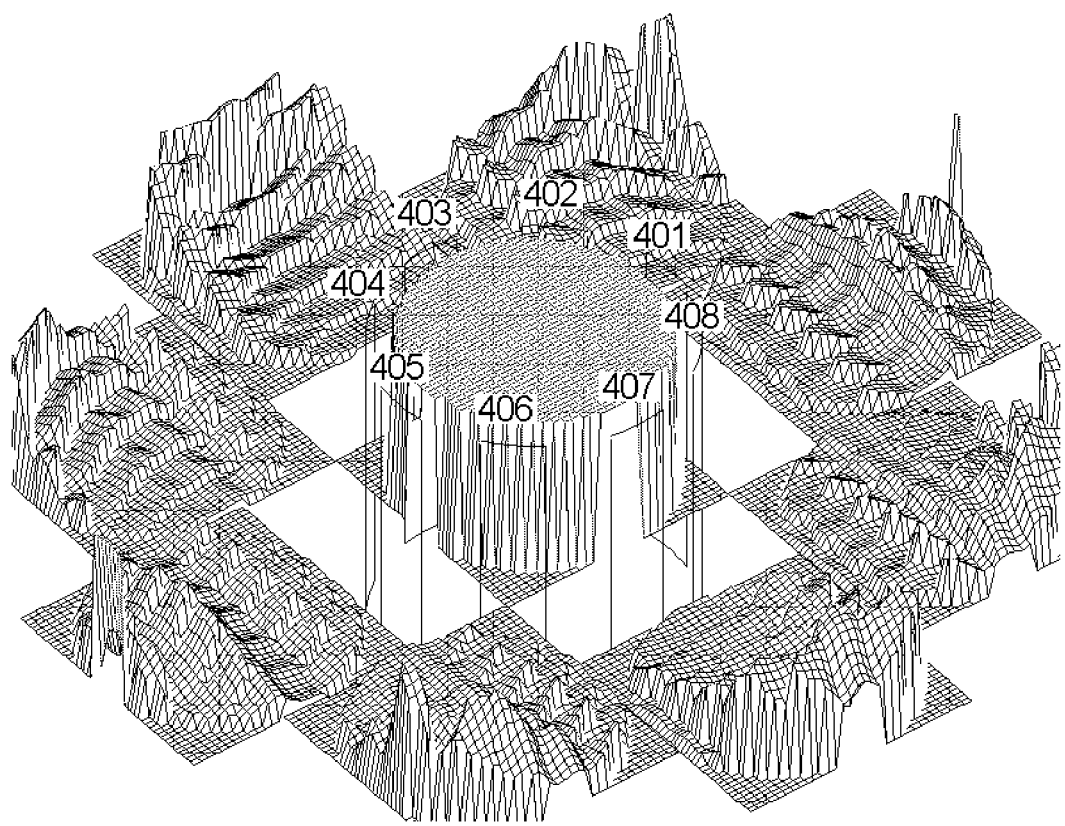
FIG. 4 is an illustration of exemplary parallel excitation of an exemplary cylindrical object inside an exemplary transmit array.

An exemplary simulation study confirmed that, in producing comparable excitation profiles, parallel excitation with the described RF pulse design tends to significantly outperform conventional volume coil excitation in terms of SAR. A further exemplary simulation study was directed to parallel excitation, using 2D pulses calculated based on exemplary equation 8, of a 24 cm-diameter uniform cylinder object inside an 8-element transmit array. FIG. 4 for example is an illustration of exemplary parallel excitation (at R=6) of the cylinder object inside a first exemplary 8-element transmit array. The center comprises an exemplary illustration of the exemplary eight under-lapped elements 401, 402, 403, 404, 405, 406, 407, and 408 of the array that were distributed azimuthally on a 28 cm-diameter shell and the resulting flat excitation profile. The surrounding profiles comprise exemplary excitation profiles from the elements if they had been driven separately. 2D pulses for achieving a flat target profile with other acceleration factors were also calculated based on exemplary equation 8 and used in the simulation study. In all cases the corresponding $g_r$ maps (one $g_r$ value for each set of "coupled" pixels, showing $g_r$ factor's spatial distribution) were further computed based on exemplary equation 9. The exemplary study was repeated for a second exemplary transmit array that was of the same overall geometry but with wider and overlapped elements.

Figure 5:
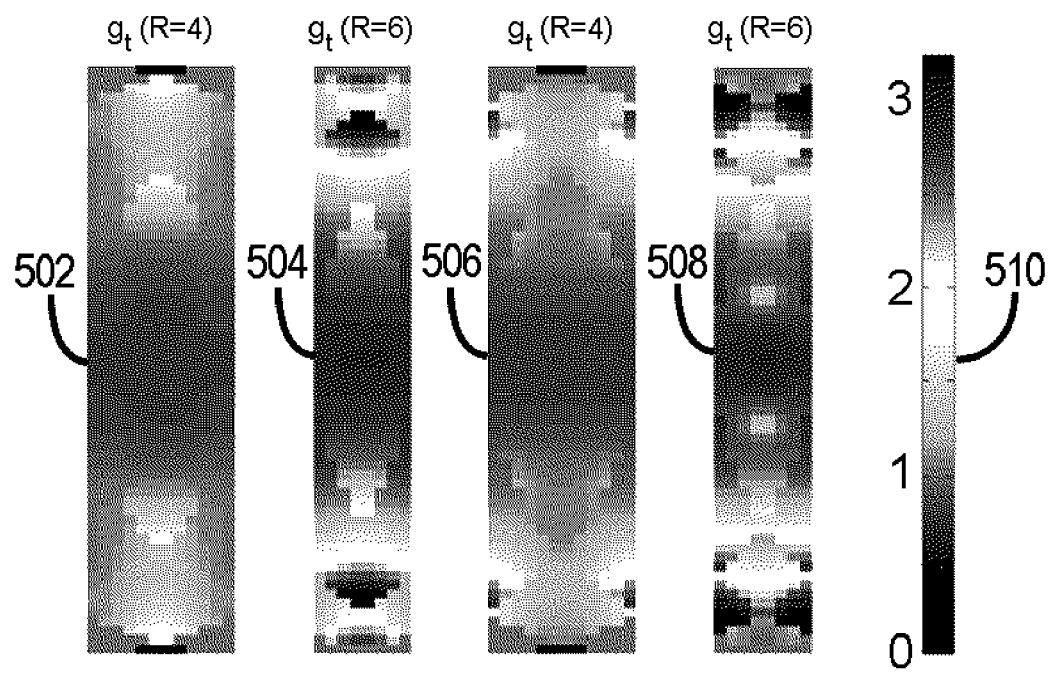
FIG. 5 is an illustration of exemplary characteristics of RF power deposition accompanying parallel transmission.

FIG. 5 is an illustration of exemplary characteristics of RF power deposition accompanying parallel transmission. FIG. 5 illustrates the $g_r$ maps 502 and 504 at R=4 and R=6, respectively, with the array illustrated in FIG. 4. FIG. 5 further illustrates the $g_r$ maps 506 and 508 at R=4 and R=6, respectively, with the second exemplary 8-element transmit array. Reference may be made to an exemplary scale bar 510, for example, a color-scale bar or gray-scale bar. Normalized $\xi_{min}/R$ at R=1, 4, and 6 for the first array were 1, 0.85 and 1.01, respectively. The corresponding $\xi_{min}/R$ values R=1, 4, and 6 for the second array were 0.97, 0.91 and 1.20, respectively. In terms of $\xi_{min}/R$, the first exemplary array outperformed the second exemplary array in the accelerated cases but slightly under-performed at R=1. Both exemplary arrays performed relatively better at R=4 than at R=1.

Unlike SENSE reconstruction where noise correlation between "coupled" pixels in an example does not impact perceived SNR, the total dissipated RF energy in parallel excitation in an example is generally affected by the ($B_1$ profile- and gradient trajectory-controlled) "pixel coupling". For a given target profile, this may change the SAR in either direction. Exemplary optimization of the parallel excitation pulses in an example serves to achieve high SAR-efficiency.

With an exemplary approach, designed RF pulses are synthesized, amplified and fed to corresponding transmit elements in parallel to induce both spatial and temporal variations of the composite $B_1$ field, which, accompanied by appropriate gradient changes played out in synchrony, create a desired excitation profile upon completion of excitation. This is in contrast to a conventional approach, where the design of coil geometry and the offsets of driving-port phase/magnitude target $B_1$-field spatial homogeneity, and an RF pulse played during excitation is limited to manipulate $B_1$-field temporal variation only. One skilled in the art will recognize that inducing appropriate $B_1$ spatiotemporal variations for excitation bears significant ramifications on RF excitation performance. That is parallel excitation accommodates excitation acceleration and/or SAR control without substantial sacrifice in the accuracy of producing the desired excitation profile.

In summary, the RF pulse driving a transmit element can be calculated with an optimization algorithm, the capacity for accelerating multi-dimensional excitation by the means of k-space sampling density reduction lies with the suppression of aliasing lobes and can be achieved by appropriately designed driving RF pulses (spatial-frequency domain weightings), and SAR management can be accomplished by minimizing a quadratic function in the driving RF pulse waveforms, which searches a way of orchestrating the RF pulses to achieve a desired excitation profile and/or acceleration while inducing an electric field E with minimum ensuing RF power deposition.

From an exemplary application perspective, fast imaging is an area where the present parallel excitation approach is particularly applicable. Under exemplary circumstances where the anatomy of interest is contained in a local region for example, multi-dimensional excitation that "spotlights" the region allows acceleration of imaging by alleviating the burden of spatial encoding inflicted on signal acquisition. Representing exemplary improvements over conventional excitations, multi-fold shorter parallel excitations support imaging volume definition/steering, for example, while breaking the time cost barrier that hindered the practical use of multi-dimensional pulses in the past. Compared to the use of a parallel acquisition approach, focused imaging based on the parallel excitation approach is not subject to the unique SNR degradation described by the geometric factor. Combined use of the two approaches is possible and can provide an even greater capacity for scan time reduction. While the exemplary experiments described focused on 2D localization, the parallel excitation approach applies to the creation and acceleration of general 2D excitation profiles, with exemplary utilities including correction for field imperfection-induced effects and non-Fourier spatial encoding. An exemplary approach is applicable to 3D acquisition.

In high field imaging, the transmit system and driving approach and/or configuration may be used in an example to both manage excitation profile and regulate RF power deposition. Embodying an integrated treatment of excitation pulses and transmit coils an exemplary approach facilitates excitation profile control. Transmission with a distributed parallel system, acceleration of excitation and management of SAR further provides a solution to power deposition at high field strength.

Therefore, in accordance with one embodiment, the invention is embodied in a computer program stored on a computer readable storage medium and having instructions which, when executed by a computer, cause the computer acquire a $B_1$ field map for each transmit coil of a transmit coil array and determine from the $B_1$ field maps an excitation pulse scheme for achieving a desired excitation profile. The computer is also caused to generate an RF pulsing sequence tailored to each respective transmit coil such that RF power deposition during imaging is reduced.

According to another aspect, the present invention includes an MR apparatus comprising an MR system. The MR system has a magnet to impress a polarizing magnetic field, a plurality of gradient coils positioned about the bore of the magnet to impose a magnetic field gradient, and an RF transceiver system and an RF switch controlled by a pulse module to transmit RF signals to an RF coil assembly to acquire MR images. A transmit coil array having a plurality of transmit coils is also disclosed. The apparatus also includes a computer programmed to regulate RF power deposition on a subject (SAR) during MR imaging through independent control of the plurality of transmit coils.

In accordance with another aspect of the invention, a method of MR imaging includes determining a region-of-interest within a subject and controlling RF excitation by a plurality of independent transmit coils of a transmit coil array such that RF power deposition on the subject is reduced.

A system composed of multiple transmit coils with corresponding RF pulse synthesizers and amplifiers is disclosed. A method of designing RF pulses specific to each transmit coil to dynamically control RF power deposition across an imaging volume is also disclosed, where parallel excitation with the transmit coils allows for management of RF power deposition on a subject while facilitating faithful production of a desired excitation profile. The present invention also supports reduction in scan time and is applicable to any coil array geometry.

A computer readable storage medium 28 in an example comprises a computer program stored thereon and represents a set of instructions that when executed by a computer 20 during MR imaging causes the computer 20 to perform as follows. A B1 field map is acquired for each transmit coil 72 of a parallel RF transmit coil array 70. The parallel RF transmit coil array 70 is capable of having any parallel RF transmit coil array geometry. With a computational algorithm, an excitation pulse scheme for a target excitation profile is determined based on at least one effective B1 field map for a plurality of transmit coils 72 of the parallel RF transmit coil array 70. Each effective B1 field map reflects inductive coupling effects present between a transmit coil 72 and at least another transmit coil 72. At least one SAR-reduced RF pulsing sequence is generated for a respective transmit coil 72 of the plurality of transmit coils 72 of the parallel RF transmit coil array 70.

The set of instructions during MR imaging in an example causes the computer 20 to generate the at least one SAR-reduced RF pulsing sequence based on a quadratic-form relation between RF pulses and RF power deposition. The at least one SAR-reduced RF pulsing sequence minimizes the RF power deposition across an imaging volume without causing substantial deviation of an RF excitation profile created by the parallel RF transmit coil array 70 from the target excitation profile.

The set of instructions during MR imaging in an example causes the computer 20 to generate the at least one SAR-reduced RF pulsing sequence based on an optimization algorithm and using as inputs at least one effective B1 field map for the transmit coils 72 and a quadratic-form relation between RF pulses and RF power deposition.

The set of instructions during MR imaging in an example causes the computer 20 to generate the at least one SAR-reduced RF pulsing sequence, based on solving an optimization algorithm and using as inputs at least one effective B1 field map for the transmit coils 72, a quadratic-form relation between RF pulses and RF power deposition, and a gradient pulsing sequence.

The set of instructions during MR imaging in an example causes the computer 20 to generate the at least one SAR-reduced RF pulsing sequence, based on solving an optimization algorithm with a matrix inversion formula and using as inputs at least one effective B1 field map for the transmit coils 72, a quadratic-form relation between RF pulses and RF power deposition, and a gradient pulsing sequence.

The set of instructions during MR imaging in an example causes the computer 20 to generate the at least one SAR-reduced RF pulsing sequence based on a predetermined relation between RF pulses and RF power deposition. The at least one SAR-reduced RF pulsing sequence minimizes the power deposition across an imaging volume without causing substantial deviation of an RF excitation profile created by the parallel RF transmit coil array 70 from the target excitation profile.

The set of instructions during MR imaging in an example causes the computer 20 to generate the at least one SAR-reduced RF pulsing sequence based on solving an optimization algorithm and using as inputs at least one effective B1 field map for the transmit coils 72 and a predetermined relation between RF pulses and RF power deposition.

The set of instructions during MR imaging in an example causes the computer 20 to generate the at least one SAR-reduced RF pulsing sequence based on solving an optimization algorithm and using as inputs at least one effective B1 field map for the transmit coils 72, a predetermined relation between RF pulses and RF power deposition, and a gradient pulsing sequence.

The set of instructions during MR imaging in an example causes the computer 20 to predict relative reduction in the RF power deposition across an imaging volume.

An MR apparatus 10 in an example comprises an MR system and a computer 20. The MR system comprises a magnet 54 to impress a polarizing magnetic field, a plurality of gradient coils 72 positioned about a bore of the magnet 54 to induce a magnetic field gradient, a parallel RF transmit coil array 70 having a plurality of transmit coils 72, and an RF transceiver system 58 and an RF switch 62 to transmit RF pulses and to acquire MR images. The RF switch 62 is controlled by a pulse module 38. The computer 20 is programmed to: design an RF pulse waveform for each transmit coil 72 of a plurality of transmit coils 72 of the parallel RF transmit coil array 70 such that RF pulse length is managed and possible excitation profile side lobes are reduced; and regulate SAR during MR imaging through independent control of the plurality of transmit coils 72 of the parallel RF transmit coil array 70 based on an RF pulsing sequence optimization algorithm The steps or operations described herein are examples. There may be variations to these steps or operations without departing from the spirit of the invention. For example, the steps may be performed in a differing order, or steps may be added, deleted, or modified.

The present invention has been described in terms of the preferred embodiment, and it is recognized that equivalents, alternatives, and modifications, aside from those expressly stated, are possible and within the scope of the appending claims.

What is claimed is:

1. A computer readable storage medium having a computer program stored thereon and representing a set of instructions that when executed by a computer during MR imaging causes the computer to:

acquire a $B_1$ field map for each transmit coil of a parallel RF transmit coil array, the parallel RF transmit coil array capable of having any parallel RF transmit coil array geometry;

determine with a computational algorithm an excitation pulse scheme for a target excitation profile based on at least one effective $B_1$ field map for a plurality of transmit coils of the parallel RF transmit coil array, wherein each effective $B_1$ field map reflects inductive coupling effects present between a transmit coil and at least another transmit coil; and generate at least one SAR-reduced RF pulsing sequence for a respective transmit coil of the plurality of transmit coils of the parallel RF transmit coil array, wherein said SAR-reduced RF pulsing sequence is integrated into said excitation pulse scheme.

2. The computer readable storage medium of claim 1 wherein the set of instructions during MR imaging causes the computer to generate the at least one SAR-reduced RF pulsing sequence based on a quadratic-form relation between RF pulses and RF power deposition, wherein the at least one SAR-reduced RF pulsing sequence minimizes the RF power deposition across an imaging volume without causing substantial deviation of an RF excitation profile created by the parallel RF transmit coil array from the target excitation profile.

3. The computer readable storage medium of claim 1 wherein the set of instructions during MR imaging causes the computer to generate the at least one SAR-reduced RF pulsing sequence based on an optimization algorithm and using as inputs at least one effective B1 field map for the transmit coils and a quadratic-form relation between RF pulses and RF power deposition.

4. The computer readable storage medium of claim 1 wherein the set of instructions during MR imaging causes the computer to generate the at least one SAR-reduced RF pulsing sequence, based on solving an optimization algorithm and using as inputs at least one effective B1 field map for the transmit coils, a quadratic-form relation between RF pulses and RF power deposition, and a gradient pulsing sequence.

5. The computer readable storage medium of claim 1 wherein the set of instructions during MR imaging causes the computer to generate the at least one SAR-reduced RF pulsing sequence, based on solving an optimization algorithm with a matrix inversion formula and using as inputs at least one effective B1 field map for the transmit coils, a quadratic-form relation between RF pulses and RF power deposition, and a gradient pulsing sequence.

6. The computer readable storage medium of claim 1 wherein the set of instructions during MR imaging causes the computer to generate the at least one SAR-reduced RF pulsing sequence based on a predetermined relation between RF pulses and RF power deposition, wherein the at least one SAR-reduced RF pulsing sequence minimizes the power deposition across an imaging volume without causing substantial deviation of an RF excitation profile created by the parallel RF transmit coil array from the target excitation profile.

7. The computer readable storage medium of claim 1 wherein the set of instructions during MR imaging causes the computer to generate the at least one SAR-reduced RF pulsing sequence based on solving an optimization algorithm and using as inputs at least one effective B1 field map for the transmit coils and a predetermined relation between RF pulses and RF power deposition.

8. The computer readable storage medium of claim 1 wherein the set of instructions during MR imaging causes the computer to generate the at least one SAR-reduced RF pulsing sequence based on solving an optimization algorithm and using as inputs at least one effective B1 field map for the transmit coils, a predetermined relation between RF pulses and RF power deposition, and a gradient pulsing sequence.

9. The computer readable storage medium of claim 1 wherein the set of instructions during MR imaging causes the computer to predict relative reduction in the RF power deposition across an imaging volume.

10. An MR apparatus comprising:
an MR system that comprises a magnet to impress a polarizing magnetic field, a plurality of gradient coils positioned about a bore of the magnet to induce a magnetic field gradient, a parallel RF transmit coil array having a plurality of transmit coils, and an RF transceiver system and an RF switch to transmit RF pulses and to acquire MR images, wherein the RF switch is controlled by a pulse module; and
a computer programmed to:
design an RF pulse waveform for each transmit coil of a plurality of transmit coils of the parallel RF transmit coil array such that RF pulse length is managed and possible excitation profile side lobes are reduced; and
regulate SAR during MR imaging through independent control of the plurality of transmit coils of the parallel RF transmit coil array based on an RF pulsing sequence optimization algorithm, wherein said RF pulsing sequence optimization algorithm combines said RF pulse waveform design and said SAR regulation.

11. The MR apparatus of claim 10 wherein the computer is programmed, based on a quadratic-form relation between the RF pulses and the RF power deposition, to simultaneously achieve RF excitation consistent with a target excitation profile and SAR reduction on the subject.

12. The MR apparatus of claim 10 wherein the computer is programmed to design RF pulse waveforms, based on solving an optimization algorithm and using as inputs at least one effective B1 field map for the plurality of transmit coils of the parallel RF transmit coil array and a quadratic-form relation between the RF pulses and the RF power deposition.

13. The MR apparatus of claim 10 wherein the computer is programmed to design RF pulse waveforms, based on solving an optimization algorithm and using as inputs at least one effective B1 field map for the plurality of transmit coils of the parallel RF transmit coil array, a quadratic-form relation between the RF pulses and the RF power deposition, and a gradient pulsing sequence.

14. The MR apparatus of claim 10 wherein the computer is programmed to design RF pulse waveforms, based on solving an optimization algorithm with a matrix inversion formula and using as inputs at least one effective B1 field map for the plurality of transmit coils of the parallel RF transmit coil array, a quadratic-form relation between the RF pulses and the RF power deposition, and a gradient pulsing sequence.

15. The MR apparatus of claim 10 wherein the plurality of transmit coils of the parallel RF transmit coil array is linearly arranged.

16. The MR apparatus of claim 10 wherein each transmit coil is driven by a dedicated RF power amplifier.

17. The MR apparatus of claim 10 wherein the computer is programmed to control RF excitation of the parallel RF transmit coil array to focus RF excitation on a region-of-interest within the subject.

18. The MR apparatus of claim 10 wherein the computer is programmed to quantify relative reduction in the RF power deposition across an imaging volume.

19. A method of MR imaging comprising
determining at least one of a region-of-interest in and an excitation profile over an imaging volume;
determining an excitation pulse scheme for a target excitation profile based on at least one effective $B_1$ field map for a parallel RF transmit coil array, wherein each effective $B_1$ field map reflects possible inductive coupling effects that exist between a transmit coil and at least another transmit coil; and
independently controlling RF pulsing of a plurality of transmit coils of the parallel RF transmit coil array such that RF power deposition is reduced, wherein said RF pulsing is integrated as part of said excitation pulse scheme.

20. The method of claim 19 further comprising the step of:
determining an RF pulsing scheme based on solving an optimization algorithm with a matrix inversion formula and using as inputs at least one effective B1 field map for the transmit coils, a quadratic-form relation between RF pulses and the RF power deposition, and a gradient pulsing sequence.

\* \* \* \* \*

UNITED STATES PATENT AND TRADEMARK OFFICE
CERTIFICATE OF CORRECTION

PATENT NO.         : 7,385,396 B2
APPLICATION NO.    : 11/379403
DATED              : June 10, 2008
INVENTOR(S)        : Zhu It is certified that error appears in the above-identified patent and that said Letters Patent is hereby corrected as shown below:

In Column 1, Line 14, delete "process" and insert -- precess --, therefor.

In Column 6, Line 32, after "I.60601-2-33" insert -- . --.

In Column 7, Line 54, in Equation (7), delete "$C_{p1,p2} f_{p1,p2} = \text{Exemplary equation 7}$"

and insert -- $\mathbf{C}_{p1,p2} \mathbf{f}_{p1,p2} = \mu_{p1,p2}$ Exemplary equation 7 --, therefor.

In Column 14, Line 57, in Claim 19, delete "comprising" and insert -- comprising: --, therefor.

Signed and Sealed this
Fourteenth Day of June, 2011

David J. Kappos
*Director of the United States Patent and Trademark Office*